US009008330B2

(12) United States Patent
Sheen et al.

(10) Patent No.: US 9,008,330 B2
(45) Date of Patent: Apr. 14, 2015

(54) CROSSOVER FREQUENCY ADJUSTMENTS FOR AUDIO SPEAKERS

(71) Applicants: Timothy W. Sheen, Brighton, MA (US); Michael Darrell Andrew Ericson, Santa Barbara, CA (US); William H. Bush, Santa Clarita, CA (US)

(72) Inventors: Timothy W. Sheen, Brighton, MA (US); Michael Darrell Andrew Ericson, Santa Barbara, CA (US); William H. Bush, Santa Clarita, CA (US)

(73) Assignee: Sonos, Inc., Santa Barbara, CA (US)

( * ) Notice: Subject to any disclaimer, the term of this patent is extended or adjusted under 35 U.S.C. 154(b) by 299 days.

(21) Appl. No.: 13/630,565

(22) Filed: Sep. 28, 2012

(65) Prior Publication Data

US 2014/0093096 A1 Apr. 3, 2014

(51) Int. Cl.
*H03G 5/00* (2006.01)
*H04R 3/14* (2006.01)

(52) U.S. Cl.
CPC .................................... *H04R 3/14* (2013.01)

(58) Field of Classification Search
USPC .......................................................... 381/99
See application file for complete search history.

(56) References Cited

U.S. PATENT DOCUMENTS

| | | | |
|---|---|---|---|
| 5,553,147 | A | 9/1996 | Pineau |
| 5,668,884 | A | 9/1997 | Clair, Jr. et al. |
| 5,673,323 | A | 9/1997 | Schotz et al. |
| 5,923,902 | A | 7/1999 | Inagaki |
| 5,946,343 | A | 8/1999 | Schotz et al. |
| 6,256,554 | B1 | 7/2001 | DiLorenzo |
| 6,404,811 | B1 | 6/2002 | Cvetko et al. |
| 6,522,886 | B1 | 2/2003 | Youngs et al. |
| 6,611,537 | B1 | 8/2003 | Edens et al. |
| 6,631,410 | B1 | 10/2003 | Kowalski et al. |
| 6,757,517 | B2 | 6/2004 | Chang |
| 6,778,869 | B2 | 8/2004 | Champion |
| 6,916,980 | B2 | 7/2005 | Ishida et al. |

(Continued)

FOREIGN PATENT DOCUMENTS

| | | |
|---|---|---|
| WO | 0153994 | 7/2001 |
| WO | 2013012582 A1 | 1/2013 |

OTHER PUBLICATIONS

"UPnP; "Universal Plug and Play Device Architecture"; Jun. 8, 2000; version 1.0; Microsoft Corporation; pp. 1-54".

(Continued)

*Primary Examiner* — Alexander Jamal
(74) *Attorney, Agent, or Firm* — McDonnell Boehnen Hulbert & Berghoff LLP

(57) ABSTRACT

Methods and systems are provided for adjusting a crossover frequency between a plurality of audio speakers rendering audio content. In one example, a first subset of a plurality of audio speakers may be rendering a first sub-range of a range of audio frequencies of an audio content, and a second subset of speakers of the plurality of audio speakers may be rendering a second sub-range of the range of audio frequencies. In this example, the first sub-range and the second sub-range may be substantially separated at the crossover frequency. In one case, a playback volume at which the audio content is being rendered may be adjusted. In one instance, the crossover frequency may be adjusted in response to the volume adjustment to improve the audio content rendering quality by the respective subsets of audio speakers in the plurality of audio speakers.

20 Claims, 9 Drawing Sheets

(56) References Cited

U.S. PATENT DOCUMENTS

| | | | | |
|---|---|---|---|---|
| 6,931,134 | B1 | 8/2005 | Waller, Jr. et al. | |
| 7,130,608 | B2 | 10/2006 | Hollstrom et al. | |
| 7,130,616 | B2 | 10/2006 | Janik | |
| 7,143,939 | B2 | 12/2006 | Henzerling | |
| 7,171,010 | B2 | 1/2007 | Martin et al. | |
| 7,236,773 | B2 | 6/2007 | Thomas | |
| 7,571,014 | B1 | 8/2009 | Lambourne et al. | |
| 7,643,894 | B2 | 1/2010 | Braithwaite et al. | |
| 7,657,910 | B1 | 2/2010 | McAulay et al. | |
| 7,792,311 | B1 | 9/2010 | Holmgren et al. | |
| 8,014,423 | B2 | 9/2011 | Thaler et al. | |
| 8,045,952 | B2 | 10/2011 | Qureshey et al. | |
| 8,103,009 | B2 | 1/2012 | McCarty et al. | |
| 8,234,395 | B2 | 7/2012 | Millington | |
| 2001/0042107 | A1 | 11/2001 | Palm | |
| 2002/0022453 | A1 | 2/2002 | Balog et al. | |
| 2002/0026442 | A1 | 2/2002 | Lipscomb et al. | |
| 2002/0078161 | A1 | 6/2002 | Cheng | |
| 2002/0124097 | A1 | 9/2002 | Isely et al. | |
| 2003/0002689 | A1 | 1/2003 | Folio | |
| 2003/0157951 | A1 | 8/2003 | Hasty | |
| 2003/0161479 | A1 | 8/2003 | Yang et al. | |
| 2004/0024478 | A1 | 2/2004 | Hans et al. | |
| 2005/0147261 | A1 | 7/2005 | Yeh | |
| 2007/0003067 | A1 | 1/2007 | Gierl et al. | |
| 2007/0142944 | A1 | 6/2007 | Goldberg et al. | |
| 2008/0144864 | A1 | 6/2008 | Huon | |
| 2010/0067716 | A1 * | 3/2010 | Katayama | 381/99 |
| 2011/0044476 | A1 | 2/2011 | Burlingame et al. | |
| 2011/0299696 | A1 | 12/2011 | Holmgren et al. | |
| 2012/0096125 | A1 | 4/2012 | Kallai et al. | |
| 2013/0022221 | A1 | 1/2013 | Kallai et al. | |

OTHER PUBLICATIONS

Voyetra; Turtle Beach Inc., "AudioTron Quick Start Guide, Version 1.0", Mar. 2001, 24 pages.

Voyetra; Turtle Beach Inc., "AudioTron Reference Manual, Version 3.0", May 2002, 70 pages.

Voyetra; Turtle Beach Inc., "AudioTron Setup Guide, Version 3.0", May 2002, 38 pages.

AudioTron Setup Guide, Version 3.0, Voyetra Turtle Beach, Inc., May 2002, 38 pages.

Bluetooth. "Specification of the Bluetooth System: The ad hoc SCATTERNET for affordable and highly functional wireless connectivity" Core, Version 1.0 A, Jul. 26, 1999, 1068 pages.

Bluetooth. "Specification of the Bluetooth System: Wireless connections made easy" Core, Version 1.0 B, Dec. 1, 1999, 1076 pages.

Dell, Inc. "Dell Digital Audio Receiver: Reference Guide" Jun. 2000, 70 pages.

Dell, Inc. "Start Here" Jun. 2000, 2 pages.

Jo J., et al., "Synchronized One-to-many Media Streaming with Adaptive Playout Control," Proceedings of SPIE, 2002, vol. 4861, pp. 71-82.

Jones, Stephen. "Dell Digital Audio Receiver: Digital upgrade for your analog stereo" Analog Stereo. Jun. 24, 2000 <http://www.reviewsonline.com/articles/961906864.htm> retrieved Jun. 18, 2014, 2 pages.

Louderback, Jim. "Affordable Audio Receiver Furnishes Homes With MP3" TechTV Vault. Jun. 28, 2000 <http://www.g4tv.com/articles/17923/affordable-audio-receiver-furnishes-homes-with-mp3/> retrieved Jul. 10, 2014, 2 pages.

Palm, Inc. "Handbook for the Palm VII Handheld" May 2000, 311 pages.

"Presentations at WinHEC 2000" May 2000, 138 pages.

* cited by examiner

CROSSOVER FREQUENCY ADJUSTMENTS FOR AUDIO SPEAKERS

FIELD OF THE DISCLOSURE

The disclosure is related to consumer goods and, more particularly, to systems, products, features, services, and other items directed to media playback or some aspect thereof.

BACKGROUND

Technological advancements have increased the accessibility of music content, as well as other types of media, such as television content, movies, and interactive content. For example, a user can access audio, video, or both audio and video content over the Internet through an online store, an Internet radio station, a music service, a movie service, and so on, in addition to the more traditional avenues of accessing audio and video content. As access to audio, video, and both audio and video content inside and outside of the home increases, improved means for enjoying the available content continues to be beneficial.

BRIEF DESCRIPTION OF THE DRAWINGS

Features, aspects, and advantages of the presently disclosed technology are better understood with regard to the following description, appended claims, and accompanying drawings where:

Figure 1:
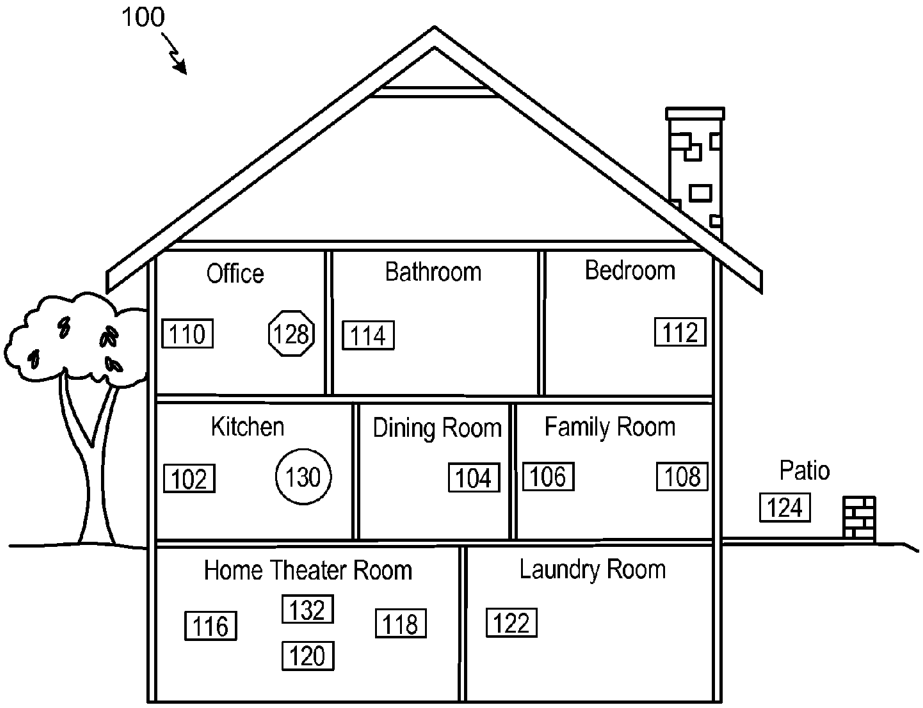
FIG. 1 shows an example configuration in which certain embodiments may be practiced.

In addition, the drawings are for the purpose of illustrating example embodiments, but it is understood that the inventions are not limited to the arrangements and instrumentality shown in the drawings.

DETAILED DESCRIPTION

I. Overview

Listening to audio content out loud can be a social activity that involves family, friends, or both. Audio content may include, for instance, music, talk radio, books, audio from television, and other audible material. For example, in a household, people may play music out loud at parties and other social gatherings. In such an environment, people may wish to play the music in one listening zone or multiple listening zones simultaneously, such that the music in each listening zone may be synchronized, without audible echoes or glitches. Listening to audio content out loud can also be an individual experience. For example, an individual may play music out loud for themselves in the morning before work, in the evening during dinner, or at other times throughout the day at home, work, or on the road. For these individual experiences, the individual may choose to either use headphones or limit the out loud playback of audio content to a single zone or area.

In one example, an audio system may include one or more audio players, often referred to herein as zone players or playback devices or players, and controllers, which may also be a player in some instances. A controller may be used to control the playback system, and can include capabilities for, among other things, browsing and selecting audio content for playback, viewing and editing audio content in one or more playback queues, or grouping and ungrouping zone players into one or more listening zones, etc. According to an embodiment, the playback system may operate as a distributed system such that each controller has full control over the entire playback system, and each player has the ability to play audio content from the either a same audio source or a different audio source as another player.

In one example, different zone players and/or audio speakers in the audio system may be configured to render different frequency sub-ranges of the audio content selected for playback. The different frequency sub-ranges may be substantially separated by one or more crossover frequencies. In one case, the crossover frequencies between the different frequency sub-ranges may be determined according to playback characteristics of respective zone players and/or audio speakers within the audio system. Accordingly, the playback of the audio system may be improved by having each zone player and/or audio speaker render frequency sub-ranges most suitable for rendering by the respective zone player and/or audio speaker.

In some cases, however, the playback characteristics of the respective zone players and/or audio speakers may vary according to the playback volume of the zone players and/or audio speakers. In other words, a particular zone player and/or audio speaker capable of clearly rendering a particular frequency sub-range at a first volume, may not be capable of rendering the particular frequency sub-range as clearly at a second volume. Accordingly, embodiments are provided for adjusting frequency sub-ranges and their associated crossover frequencies according to changes in the playback volume of the audio system. In some embodiments, the crossover frequencies may also be adjusted according to changes in playback equalization of the audio system.

In one aspect, a method is provided. The method involves causing a first subset of a plurality of audio speakers to render a first sub-range of a range of audio frequencies of an audio content, and a second subset of speakers of the plurality of audio speakers to render a second sub-range of the range of audio frequencies. The first sub-range and the second sub-range are substantially separated at a first crossover frequency. The method may further involve detecting a playback volume adjustment of the audio content rendered by the plurality of speakers, and causing an adjustment of the first crossover frequency substantially separating the first sub-range and second sub-range based on the adjusted playback volume.

In another aspect, a system is provided. The system includes at least one processor, a non-transitory computer readable medium, and program instructions stored on the non-transitory computer readable medium. The program instructions are executable by the at least one processor to perform functions including causing a first subset of a plurality of audio speakers to render a first sub-range of a range of audio frequencies of an audio content, and a second subset of speakers of the plurality of audio speakers to render a second sub-range of the range of audio frequencies. The first sub-range and the second sub-range are substantially separated at a first crossover frequency. The functions may further involve detecting a playback volume adjustment of the audio content rendered by the plurality of speakers, and causing an adjustment of the first crossover frequency substantially separating the first sub-range and second sub-range based on the adjusted playback volume.

In yet another aspect, a non-transitory computer readable medium having instructions stored thereon is provided. The instructions are executable by a computing device to cause the computing device to perform functions including causing a first subset of a plurality of audio speakers to render a first sub-range of a range of audio frequencies of an audio content, and a second subset of speakers of the plurality of audio speakers to render a second sub-range of the range of audio frequencies. The first sub-range and the second sub-range are substantially separated at a first crossover frequency. The functions may further involve detecting a playback volume adjustment of the audio content rendered by the plurality of speakers, and causing an adjustment of the first crossover frequency substantially separating the first sub-range and second sub-range based on the adjusted playback volume.

II. Example Operating Environment

Referring now to the drawings, in which like numerals can refer to like parts throughout the figures, FIG. 1 shows an example system configuration 100 in which one or more embodiments disclosed herein can be practiced or implemented.

By way of illustration, the system configuration 100 represents a home with multiple zones, though the home could have been configured with only one zone. Each zone, for example, may represent a different room or space, such as an office, bathroom, bedroom, kitchen, dining room, family room, home theater room, utility or laundry room, and patio. A single zone might also include multiple rooms or spaces if so configured. One or more of zone players 102-124 are shown in each respective zone. A zone player 102-124, also referred to as a playback device, multimedia unit, speaker, player, and so on, provides audio, video, and/or audiovisual output. A controller 130 (e.g., shown in the kitchen for purposes of illustration) provides control to the system configuration 100. Controller 130 may be fixed to a zone, or alternatively, mobile such that it can be moved about the zones. The system configuration 100 may also include more than one controller 130. The system configuration 100 illustrates an example whole house audio system, though it is understood that the technology described herein is not limited to its particular place of application or to an expansive system like a whole house audio system 100 of FIG. 1.

a. Example Zone Players

Figure 2A:
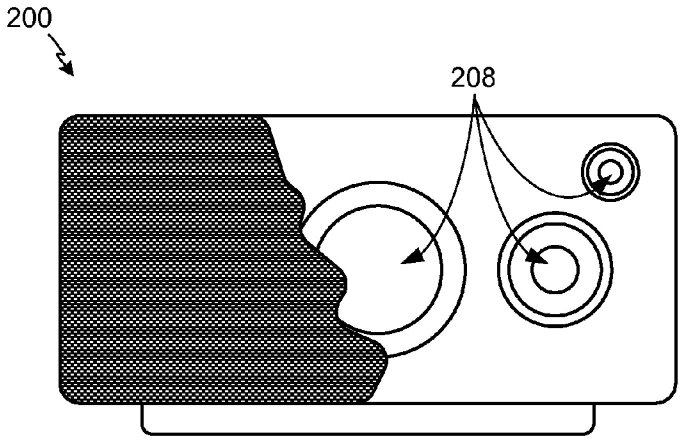
FIG. 2A shows an illustration of an example zone player having a built-in amplifier and transducers.
Figure 2B:
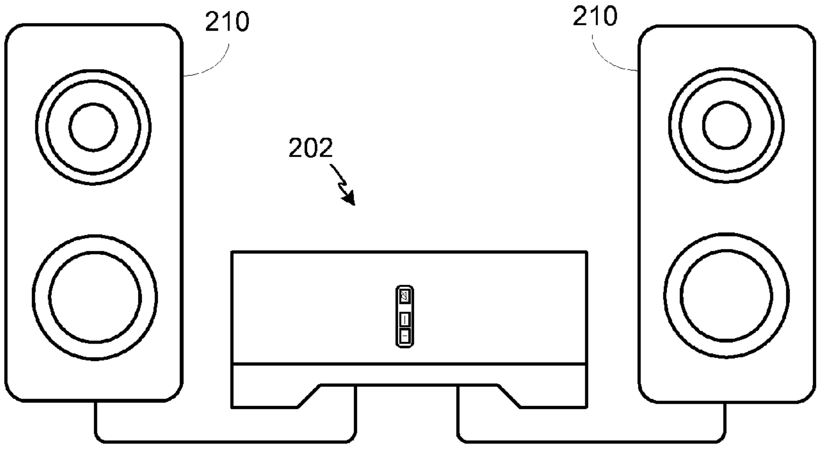
FIG. 2B shows an illustration of an example zone player having a built-in amplifier and connected to external speakers.
Figure 2C:
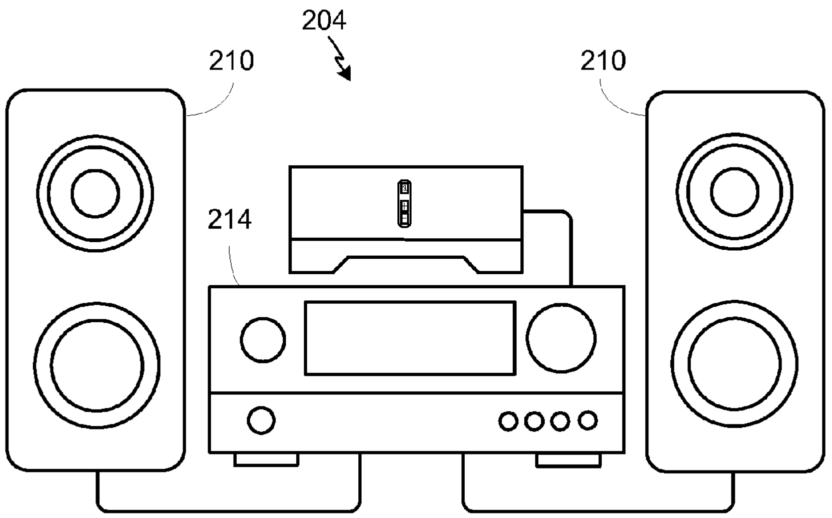
FIG. 2C shows an illustration of an example zone player connected to an A/V receiver and speakers.

FIGS. 2A, 2B, and 2C show example types of zone players. Zone players 200, 202, and 204 of FIGS. 2A, 2B, and 2C, respectively, can correspond to any of the zone players 102-124 of FIG. 1, for example. In some embodiments, audio is reproduced using only a single zone player, such as by a full-range player. In some embodiments, audio is reproduced using two or more zone players, such as by using a combination of full-range players or a combination of full-range and specialized players. In some embodiments, zone players 200-204 may also be referred to as a "smart speaker," because they contain processing capabilities beyond the reproduction of audio, more of which is described below.

FIG. 2A illustrates zone player 200 that includes sound producing equipment 208 capable of reproducing full-range sound. The sound may come from an audio signal that is received and processed by zone player 200 over a wired or wireless data network. Sound producing equipment 208 includes one or more built-in amplifiers and one or more acoustic transducers (e.g., speakers). A built-in amplifier is described more below with respect to FIG. 4. A speaker or acoustic transducer can include, for example, any of a tweeter, a mid-range driver, a low-range driver, and a subwoofer. In some embodiments, zone player 200 can be statically or dynamically configured to play stereophonic audio, monaural audio, or both. In some embodiments, zone player 200 is configured to reproduce a subset of full-range sound, such as when zone player 200 is grouped with other zone players to play stereophonic audio, monaural audio, and/or surround audio or when the audio content received by zone player 200 is less than full-range.

FIG. 2B illustrates zone player 202 that includes a built-in amplifier to power a set of detached speakers 210. A detached speaker can include, for example, any type of loudspeaker. Zone player 202 may be configured to power one, two, or more separate loudspeakers. Zone player 202 may be configured to communicate an audio signal (e.g., right and left channel audio or more channels depending on its configuration) to the detached speakers 210 via a wired path.

FIG. 2C illustrates zone player 204 that does not include a built-in amplifier, but is configured to communicate an audio signal, received over a data network, to an audio (or "audio/video") receiver 214 with built-in amplification.

Referring back to FIG. 1, in some embodiments, one, some, or all of the zone players 102 to 124 can retrieve audio directly from a source. For example, a zone player may contain a playlist or queue of audio items to be played (also referred to herein as a "playback queue"). Each item in the queue may comprise a uniform resource identifier (URI) or some other identifier. The URI or identifier can point the zone player to the audio source. The source might be found on the Internet (e.g., the cloud), locally from another device over data network 128 (described further below), from the controller 130, stored on the zone player itself, or from an audio source communicating directly to the zone player. In some embodiments, the zone player can reproduce the audio itself, send it to another zone player for reproduction, or both where the audio is played by the zone player and one or more additional zone players in synchrony. In some embodiments, the zone player can play a first audio content (or not play at all), while sending a second, different audio content to another zone player(s) for reproduction.

By way of illustration, SONOS, Inc. of Santa Barbara, Calif. presently offers for sale zone players referred to as a "PLAY:5," "PLAY:3," "CONNECT:AMP," "CONNECT," and "SUB." Any other past, present, and/or future zone players can additionally or alternatively be used to implement the zone players of example embodiments disclosed herein. Additionally, it is understood that a zone player is not limited to the particular examples illustrated in FIGS. 2A, 2B, and 2C or to the SONOS product offerings. For example, a zone player may include a wired or wireless headphone. In yet another example, a zone player might include a sound bar for television. In yet another example, a zone player can include or interact with a docking station for an Apple IPOD™ or similar device.

b. Example Controllers

Figure 3:
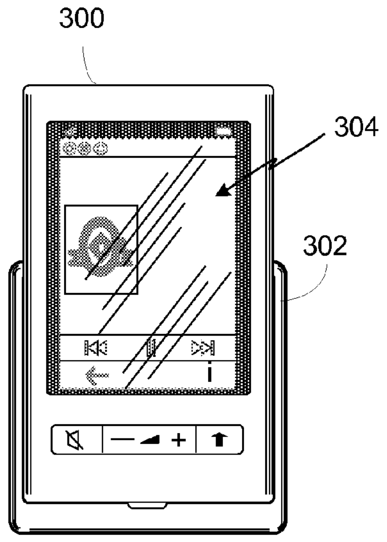
FIG. 3 shows an illustration of an example controller.

FIG. 3 illustrates an example wireless controller 300 in docking station 302. By way of illustration, controller 300 can correspond to controlling device 130 of FIG. 1. Docking station 302, if provided, may be used to charge a battery of controller 300. In some embodiments, controller 300 is provided with a touch screen 304 that allows a user to interact through touch with the controller 300, for example, to retrieve and navigate a playlist of audio items, control operations of one or more zone players, and provide overall control of the system configuration 100. In certain embodiments, any number of controllers can be used to control the system configuration 100. In some embodiments, there can be a limit set on the number of controllers that can control the system configuration 100. The controllers might be wireless like wireless controller 300 or wired to data network 128.

In some embodiments, if more than one controller is used in system 100, then each controller may be coordinated to display common content, and may all be dynamically updated to indicate changes made from a single controller. Coordination can occur, for instance, by a controller periodically requesting a state variable directly or indirectly from one or more zone players; the state variable may provide information about system 100, such as current zone group configuration, what is playing in one or more zones, playback volumes, and other items of interest. The state variable may be passed around on data network 128 between zone players (and controllers, if so desired) as needed or as often as programmed.

In addition, an application running on any network-enabled portable device, such as an IPHONE™, IPAD™, ANDROID™ powered phone, or any other smart phone or network-enabled device can be used as controller 130. An application running on a laptop or desktop personal computer (PC) or Mac™ can also be used as controller 130. Such controllers may connect to system 100 through an interface with data network 128, a zone player, a wireless router, or using some other configured connection path. Example controllers offered by Sonos, Inc. of Santa Barbara, Calif. include a "Controller 200," "SONOS® CONTROL," "SONOS® Controller for IPHONE™," "SONOS® Controller for IPAD™," "SONOS® Controller for ANDROID™," "SONOS® Controller for MAC™ or PC."

c. Example Data Connection

Zone players 102 to 124 of FIG. 1 are coupled directly or indirectly to a data network, such as data network 128. Controller 130 may also be coupled directly or indirectly to data network 128 or individual zone players. Data network 128 is represented by an octagon in the figure to stand out from other representative components. While data network 128 is shown in a single location, it is understood that such a network is distributed in and around system 100. Particularly, data network 128 can be a wired network, a wireless network, or a combination of both wired and wireless networks. In some embodiments, one or more of the zone players 102-124 are wirelessly coupled to data network 128 based on a proprietary mesh network. In some embodiments, one or more of the zone players 102-124 are wirelessly coupled to data network 128 using a non-mesh topology. In some embodiments, one or more of the zone players 102-124 are coupled via a wire to data network 128 using Ethernet or similar technology. In addition to the one or more zone players 102-124 connecting to data network 128, data network 128 can further allow access to a wide area network, such as the Internet.

In some embodiments, connecting any of the zone players 102-124, or some other connecting device, to a broadband router, can create data network 128. Other zone players 102-124 can then be added wired or wirelessly to the data network 128. For example, a zone player (e.g., any of zone players 102-124) can be added to the system configuration 100 by simply pressing a button on the zone player itself (or perform some other action), which enables a connection to be made to data network 128. The broadband router can be connected to an Internet Service Provider (ISP), for example. The broadband router can be used to form another data network within the system configuration 100, which can be used in other applications (e.g., web surfing). Data network 128 can also be used in other applications, if so programmed. An example, second network may implement SONOSNET™ protocol, developed by SONOS, Inc. of Santa Barbara. SONOSNET™ represents a secure, AES-encrypted, peer-to-peer wireless mesh network. Alternatively, in certain embodiments, the data network 128 is the same network, such as a traditional wired or wireless network, used for other applications in the household.

d. Example Zone Configurations

A particular zone can contain one or more zone players. For example, the family room of FIG. 1 contains two zone players 106 and 108, while the kitchen is shown with one zone player 102. In another example, the home theater room contains additional zone players to play audio from a 5.1 channel or greater audio source (e.g., a movie encoded with 5.1 or greater audio channels). In some embodiments, one can position a zone player in a room or space and assign the zone player to a new or existing zone via controller 130. As such, zones may be created, combined with another zone, removed, and given a specific name (e.g., "Kitchen"), if so desired and programmed to do so with controller 130. Moreover, in some embodiments, zone configurations may be dynamically changed even after being configured using controller 130 or some other mechanism.

In some embodiments, if a zone contains two or more zone players, such as the two zone players 106 and 108 in the family room, then the two zone players 106 and 108 can be configured to play the same audio source in synchrony, or the two zone players 106 and 108 can be paired to play two separate sounds in left and right channels, for example. In other words, the stereo effects of a sound can be reproduced or enhanced through the two zone players 106 and 108, one for the left sound and the other for the right sound. In certain embodiments, paired zone players (also referred to as "bonded zone players") can play audio in synchrony with other zone players in the same or different zones.

In some embodiments, two or more zone players can be sonically consolidated to form a single, consolidated zone player. A consolidated zone player (though made up of multiple, separate devices) can be configured to process and reproduce sound differently than an unconsolidated zone player or zone players that are paired, because a consolidated zone player will have additional speaker drivers from which sound can be passed. The consolidated zone player can further be paired with a single zone player or yet another consolidated zone player. Each playback device of a consolidated playback device can be set in a consolidated mode, for example.

According to some embodiments, one can continue to do any of: group, consolidate, and pair zone players, for example, until a desired configuration is complete. The actions of grouping, consolidation, and pairing are preferably performed through a control interface, such as using controller 130, and not by physically connecting and re-connecting speaker wire, for example, to individual, discrete speakers to create different configurations. As such, certain embodiments described herein provide a more flexible and dynamic platform through which sound reproduction can be offered to the end-user.

e. Example Audio Sources

In some embodiments, each zone can play from the same audio source as another zone or each zone can play from a different audio source. For example, someone can be grilling on the patio and listening to jazz music via zone player 124, while someone is preparing food in the kitchen and listening to classical music via zone player 102. Further, someone can be in the office listening to the same jazz music via zone player 110 that is playing on the patio via zone player 124. In some embodiments, the jazz music played via zone players 110 and 124 is played in synchrony. Synchronizing playback amongst zones allows for someone to pass through zones while seamlessly (or substantially seamlessly) listening to the audio. Further, zones can be put into a "party mode" such that all associated zones will play audio in synchrony.

Sources of audio content to be played by zone players 102-124 are numerous. In some embodiments, music on a zone player itself may be accessed and a played. In some embodiments, music from a personal library stored on a computer or networked-attached storage (NAS) may be accessed via the data network 128 and played. In some embodiments, Internet radio stations, shows, and podcasts can be accessed via the data network 128. Music or cloud services that let a user stream and/or download music and audio content can be accessed via the data network 128. Further, music can be obtained from traditional sources, such as a turntable or CD player, via a line-in connection to a zone player, for example. Audio content can also be accessed using a different protocol, such as AIRPLAY™, which is a wireless technology by Apple, Inc., for example. Audio content received from one or more sources can be shared amongst the zone players 102 to 124 via data network 128 and/or controller 130. The above-disclosed sources of audio content are referred to herein as network-based audio information sources. However, network-based audio information sources are not limited thereto.

In some embodiments, the example home theater zone players 116, 118, 120 are coupled to an audio information source such as a television 132. In some examples, the television 132 is used as a source of audio for the home theater zone players 116, 118, 120, while in other examples audio information from the television 132 can be shared with any of the zone players 102-124 in the audio system 100.

III. Example Zone Players

Figure 4:
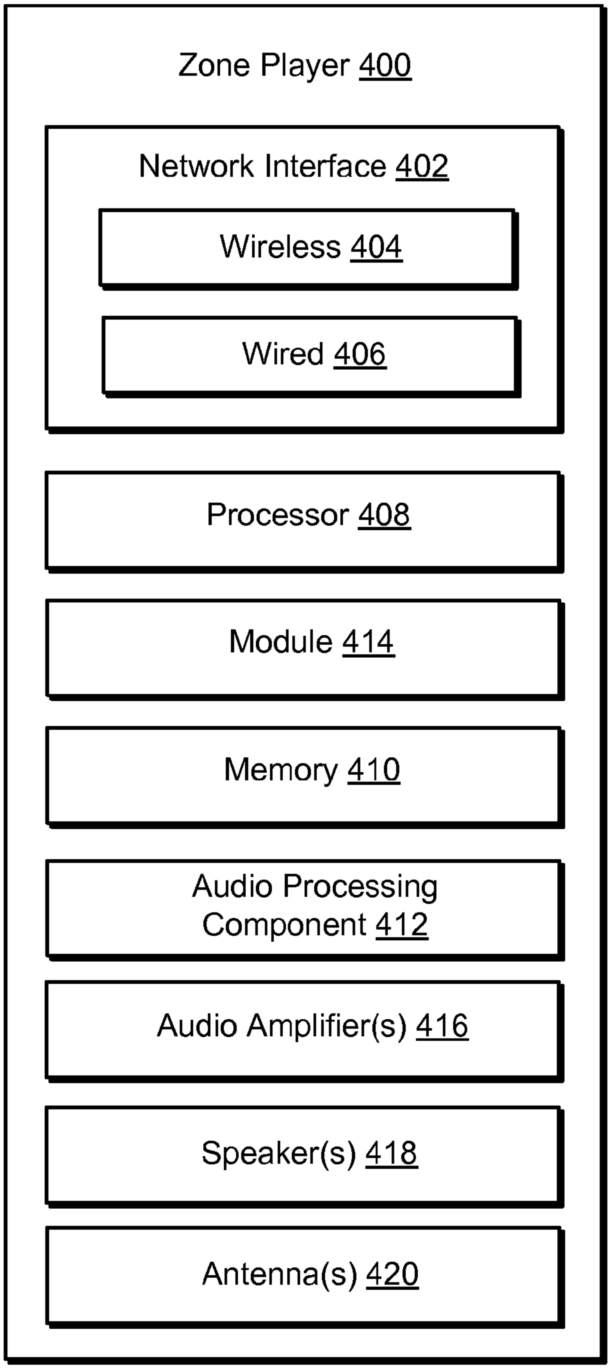
FIG. 4 shows an internal functional block diagram of an example zone player.

Referring now to FIG. 4, there is shown an example block diagram of a zone player 400 in accordance with an embodiment. Zone player 400 includes a network interface 402, a processor 408, a memory 410, an audio processing component 412, one or more modules 414, an audio amplifier 416, and a speaker unit 418 coupled to the audio amplifier 416. FIG. 2A shows an example illustration of such a zone player. Other types of zone players may not include the speaker unit 418 (e.g., such as shown in FIG. 2B) or the audio amplifier 416 (e.g., such as shown in FIG. 2C). Further, it is contemplated that the zone player 400 can be integrated into another component. For example, the zone player 400 could be constructed as part of a television, lighting, or some other device for indoor or outdoor use.

In some embodiments, network interface 402 facilitates a data flow between zone player 400 and other devices on a data network 128. In some embodiments, in addition to getting audio from another zone player or device on data network 128, zone player 400 may access audio directly from the audio source, such as over a wide area network or on the local network. In some embodiments, the network interface 402 can further handle the address part of each packet so that it gets to the right destination or intercepts packets destined for the zone player 400. Accordingly, in certain embodiments, each of the packets includes an Internet Protocol (IP)-based source address as well as an IP-based destination address.

In some embodiments, network interface 402 can include one or both of a wireless interface 404 and a wired interface 406. The wireless interface 404, also referred to as a radio frequency (RF) interface, provides network interface functions for the zone player 400 to wirelessly communicate with other devices (e.g., other zone player(s), speaker(s), receiver(s), component(s) associated with the data network 128, and so on) in accordance with a communication protocol (e.g., any wireless standard including IEEE 802.11a, 802.11b, 802.11g, 802.11n, or 802.15). Wireless interface 404 may include one or more radios. To receive wireless signals and to provide the wireless signals to the wireless interface 404 and to transmit wireless signals, the zone player 400 includes one or more antennas 420. The wired interface 406 provides network interface functions for the zone player 400 to communicate over a wire with other devices in accordance with a communication protocol (e.g., IEEE 802.3). In some embodiments, a zone player includes multiple wireless 404 interfaces. In some embodiments, a zone player includes multiple wired 406 interfaces. In some embodiments, a zone player includes both of the interfaces 404 and 406. In some embodiments, a zone player 400 includes only the wireless interface 404 or the wired interface 406.

In some embodiments, the processor 408 is a clock-driven electronic device that is configured to process input data according to instructions stored in memory 410. The memory 410 is data storage that can be loaded with one or more software module(s) 414, which can be executed by the processor 408 to achieve certain tasks. In the illustrated embodiment, the memory 410 is a tangible machine-readable medium storing instructions that can be executed by the processor 408. In some embodiments, a task might be for the zone player 400 to retrieve audio data from another zone player or a device on a network (e.g., using a uniform resource locator (URL) or some other identifier). In some embodiments, a task may be for the zone player 400 to send audio data to another zone player or device on a network. In some embodiments, a task may be for the zone player 400 to synchronize playback of audio with one or more additional zone players. In some embodiments, a task may be to pair the zone player 400 with one or more zone players to create a multi-channel audio environment. Additional or alternative tasks can be achieved via the one or more software module(s) 414 and the processor 408.

The audio processing component 412 can include one or more digital-to-analog converters (DAC), an audio preprocessing component, an audio enhancement component or a digital signal processor, and so on. In some embodiments, the audio processing component 412 may be part of processor 408. In some embodiments, the audio that is retrieved via the network interface 402 is processed and/or intentionally altered by the audio processing component 412. Further, the audio processing component 412 can produce analog audio signals. The processed analog audio signals are then provided to the audio amplifier 416 for play back through speakers 418. In addition, the audio processing component 412 can include circuitry to process analog or digital signals as inputs to play from zone player 400, send to another zone player on a network, or both play and send to another zone player on the network. An example input includes a line-in connection (e.g., an auto-detecting 3.5 mm audio line-in connection).

The audio amplifier 416 is a device(s) that amplifies audio signals to a level for driving one or more speakers 418. The one or more speakers 418 can include an individual transducer (e.g., a "driver") or a complete speaker system that includes an enclosure including one or more drivers. A particular driver can be a subwoofer (e.g., for low frequencies), a mid-range driver (e.g., for middle frequencies), and a tweeter (e.g., for high frequencies), for example. An enclosure can be sealed or ported, for example. Each transducer may be driven by its own individual amplifier.

A commercial example, presently known as the PLAY:5™, is a zone player with a built-in amplifier and speakers that is capable of retrieving audio directly from the source, such as on the Internet or on the local network, for example. In particular, the PLAY:5™ is a five-amp, five-driver speaker system that includes two tweeters, two mid-range drivers, and one woofer. When playing audio content via the PLAY:5, the left audio data of a track is sent out of the left tweeter and left mid-range driver, the right audio data of a track is sent out of the right tweeter and the right mid-range driver, and mono bass is sent out of the subwoofer. Further, both mid-range drivers and both tweeters have the same equalization (or substantially the same equalization). That is, they are both sent the same frequencies but from different channels of audio. Audio from Internet radio stations, online music and video services, downloaded music, analog audio inputs, television, DVD, and so on, can be played from the PLAY:5™.

IV. Example Controller

Figure 5:
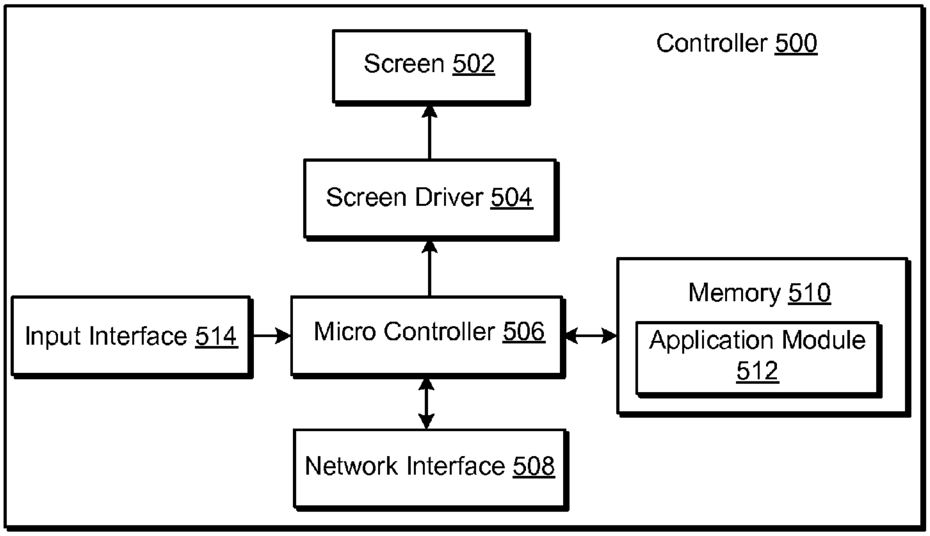
FIG. 5 shows an internal functional block diagram of an example controller.

Referring now to FIG. 5, there is shown an example block diagram for controller 500, which can correspond to the controlling device 130 in FIG. 1. Controller 500 can be used to facilitate the control of multi-media applications, automation and others in a system. In particular, the controller 500 may be configured to facilitate a selection of a plurality of audio sources available on the network and enable control of one or more zone players (e.g., the zone players 102-124 in FIG. 1) through a wireless or wired network interface 508. According to one embodiment, the wireless communications is based on an industry standard (e.g., infrared, radio, wireless standards including IEEE 802.11a, 802.11b, 802.11g, 802.11n, 802.15, and so on). Further, when a particular audio is being accessed via the controller 500 or being played via a zone player, a picture (e.g., album art) or any other data, associated with the audio and/or audio source can be transmitted from a zone player or other electronic device to controller 500 for display.

Controller 500 is provided with a screen 502 and an input interface 514 that allows a user to interact with the controller 500, for example, to navigate a playlist of many multimedia items and to control operations of one or more zone players. The screen 502 on the controller 500 can be an LCD screen, for example. The screen 500 communicates with and is commanded by a screen driver 504 that is controlled by a microcontroller (e.g., a processor) 506. The memory 510 can be loaded with one or more application modules 512 that can be executed by the microcontroller 506 with or without a user input via the user interface 514 to achieve certain tasks. In some embodiments, an application module 512 is configured to facilitate grouping a number of selected zone players into a zone group and synchronizing the zone players for audio play back. In some embodiments, an application module 512 is configured to control the audio sounds (e.g., volume) of the zone players in a zone group. In operation, when the microcontroller 506 executes one or more of the application modules 512, the screen driver 504 generates control signals to drive the screen 502 to display an application specific user interface accordingly.

The controller 500 includes a network interface 508 that facilitates wired or wireless communication with a zone player. In some embodiments, the commands such as volume control and audio playback synchronization are sent via the network interface 508. In some embodiments, a saved zone group configuration is transmitted between a zone player and a controller via the network interface 508. The controller 500 can control one or more zone players, such as 102-124 of FIG. 1. There can be more than one controller for a particular system, and each controller may share common information with another controller, or retrieve the common information from a zone player, if such a zone player stores configuration data (e.g., such as a state variable). Further, a controller can be integrated into a zone player.

It should be noted that other network-enabled devices such as an IPHONE®, IPAD® or any other smart phone or network-enabled device (e.g., a networked computer such as a PC or MAC®) can also be used as a controller to interact or control zone players in a particular environment. In some embodiments, a software application or upgrade can be downloaded onto a network-enabled device to perform the functions described herein.

In certain embodiments, a user can create a zone group (also referred to as a bonded zone) including at least two zone players from the controller 500. The zone players in the zone group can play audio in a synchronized fashion, such that all of the zone players in the zone group play back an identical audio source or a list of identical audio sources in a synchronized manner such that no (or substantially no) audible delays or hiccups are to be heard. Similarly, in some embodiments, when a user increases the audio volume of the group from the controller 500, the signals or data of increasing the audio volume for the group are sent to one of the zone players and causes other zone players in the group to be increased together in volume.

A user via the controller 500 can group zone players into a zone group by activating a "Link Zones" or "Add Zone" soft button, or de-grouping a zone group by activating an "Unlink Zones" or "Drop Zone" button. For example, one mechanism for 'joining' zone players together for audio play back is to link a number of zone players together to form a group. To link a number of zone players together, a user can manually link each zone player or room one after the other. For example, assume that there is a multi-zone system that includes the following zones: Bathroom, Bedroom, Den, Dining Room, Family Room, and Foyer.

In certain embodiments, a user can link any number of the six zone players, for example, by starting with a single zone and then manually linking each zone to that zone.

In certain embodiments, a set of zones can be dynamically linked together using a command to create a zone scene or theme (subsequent to first creating the zone scene). For instance, a "Morning" zone scene command can link the Bedroom, Office, and Kitchen zones together in one action. Without this single command, the user would manually and individually link each zone. The single command may include a mouse click, a double mouse click, a button press, a gesture, or some other programmed action. Other kinds of zone scenes can be programmed.

In certain embodiments, a zone scene can be triggered based on time (e.g., an alarm clock function). For instance, a zone scene can be set to apply at 8:00 am. The system can link appropriate zones automatically, set specific music to play, and then stop the music after a defined duration. Although any particular zone can be triggered to an "On" or "Off" state based on time, for example, a zone scene enables any zone(s) linked to the scene to play a predefined audio (e.g., a favorable song, a predefined playlist) at a specific time and/or for a specific duration. If, for any reason, the scheduled music failed to be played (e.g., an empty playlist, no connection to a share, failed Universal Plug and Play (UPnP), no Internet connection for an Internet Radio station, and so on), a backup buzzer can be programmed to sound. The buzzer can include a sound file that is stored in a zone player, for example.

V. Example Ad-Hoc Network

Figure 6:
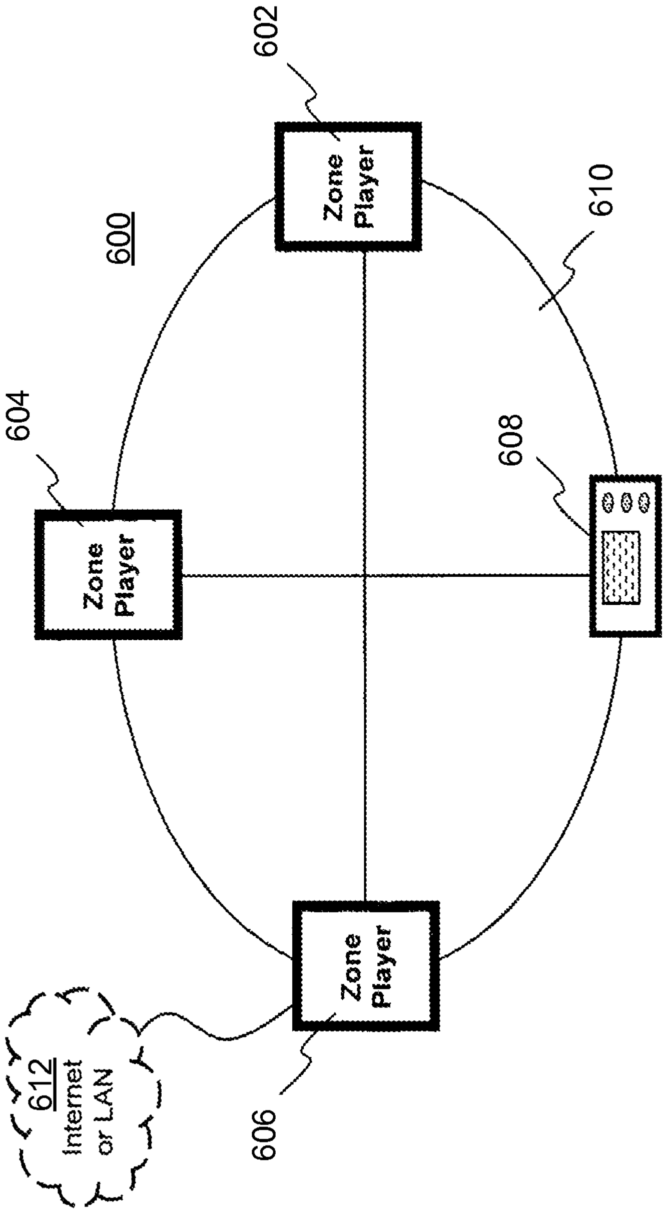
FIG. 6 shows an example ad-hoc playback network.

Certain particular examples are now provided in connection with FIG. 6 to describe, for purposes of illustration, certain systems and methods to provide and facilitate connection to a playback network. FIG. 6 shows that there are three zone players 602, 604 and 606 and a controller 608 that form a network branch that is also referred to as an Ad-Hoc network 610. The network 610 may be wireless, wired, or a combination of wired and wireless. In general, an Ad-Hoc (or "spontaneous") network is a local area network or other small network in which there is generally no one access point for all traffic. With an established Ad-Hoc network 610, the devices 602, 604, 606 and 608 can all communicate with each other in a "peer-to-peer" style of communication, for example. Furthermore, devices may join and/or leave from the network 610, and the network 610 will automatically reconfigure itself without needing the user to reconfigure the network 610. While an Ad-Hoc network is referenced in FIG. 6, it is understood that a playback network may be based on a type of network that is completely or partially different from an Ad-Hoc network.

Using the Ad-Hoc network 610, the devices 602, 604, 606, and 608 can share or exchange one or more audio sources and be dynamically grouped to play the same or different audio sources. For example, the devices 602 and 604 are grouped to playback one piece of music, and at the same time, the device 606 plays back another piece of music. In other words, the devices 602, 604, 606 and 608, as shown in FIG. 6, form a HOUSEHOLD that distributes audio and/or reproduces sound. As used herein, the term HOUSEHOLD (provided in uppercase letters to disambiguate from the user's domicile) is used to represent a collection of networked devices that are cooperating to provide an application or service. An instance of a HOUSEHOLD is identified with a household 610 (or household identifier), though a HOUSEHOLD may be identified with a different area or place.

In certain embodiments, a household identifier (HHID) is a short string or an identifier that is computer-generated to help ensure that it is unique. Accordingly, the network 610 can be characterized by a unique HHID and a unique set of configuration variables or parameters, such as channels (e.g., respective frequency bands), service set identifier (SSID) (a sequence of alphanumeric characters as a name of a wireless network), and WEP keys (wired equivalent privacy or other security keys). In certain embodiments, SSID is set to be the same as HHID.

In certain embodiments, each HOUSEHOLD includes two types of network nodes: a control point (CP) and a zone player (ZP). The control point controls an overall network setup process and sequencing, including an automatic generation of required network parameters (e.g., WEP keys). In an embodiment, the CP also provides the user with a HOUSEHOLD configuration user interface. The CP function can be provided by a computer running a CP application module, or by a handheld controller (e.g., the controller 308) also running a CP application module, for example. The zone player is any other device on the network that is placed to participate in the automatic configuration process. The ZP, as a notation used herein, includes the controller 308 or a computing device, for example. In some embodiments, the functionality, or certain parts of the functionality, in both the CP and the ZP are combined at a single node (e.g., a ZP contains a CP or vice-versa).

In certain embodiments, configuration of a HOUSEHOLD involves multiple CPs and ZPs that rendezvous and establish a known configuration such that they can use a standard networking protocol (e.g., IP over Wired or Wireless Ethernet) for communication. In an embodiment, two types of networks/protocols are employed: Ethernet 802.3 and Wireless 802.11g. Interconnections between a CP and a ZP can use either of the networks/protocols. A device in the system as a member of a HOUSEHOLD can connect to both networks simultaneously.

In an environment that has both networks in use, it is assumed that at least one device in a system is connected to both as a bridging device, thus providing bridging services between wired/wireless networks for others. The zone player 606 in FIG. 6 is shown to be connected to both networks, for example. The connectivity to the network 612 is based on Ethernet and/or Wireless, while the connectivity to other devices 602, 604 and 608 is based on Wireless and Ethernet if so desired.

It is understood, however, that in some embodiments each zone player 606, 604, 602 may access the Internet when retrieving media from the cloud (e.g., the Internet) via the bridging device. For example, zone player 602 may contain a uniform resource locator (URL) that specifies an address to a particular audio track in the cloud. Using the URL, the zone player 602 may retrieve the audio track from the cloud, and ultimately play the audio out of one or more zone players.

VI. Example System Configuration

Figure 7:
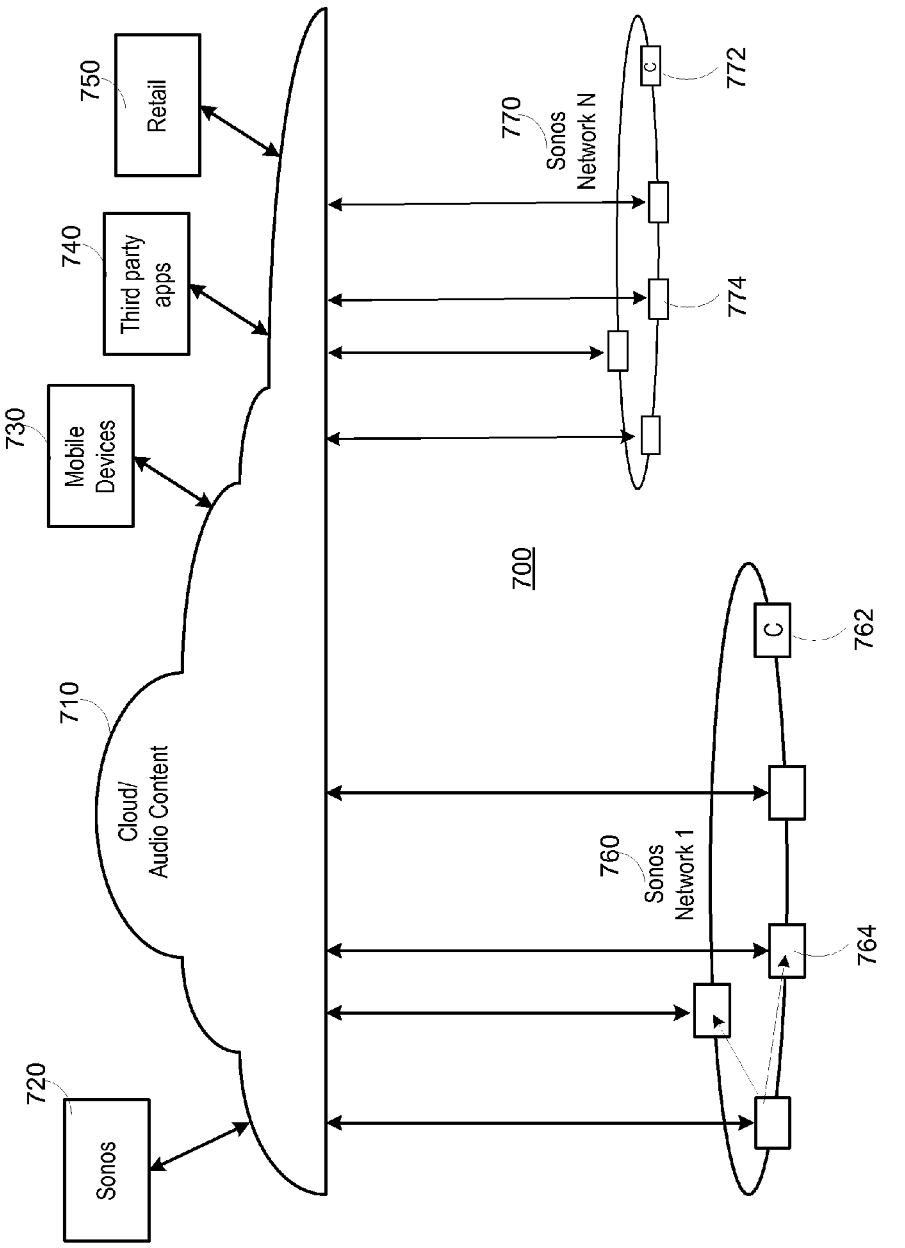
FIG. 7 shows a system including a plurality of networks including a cloud-based network and at least one local playback network.

FIG. 7 shows a system including a plurality of networks including a cloud-based network and at least one local playback network. A local playback network includes a plurality of playback devices or players, though it is understood that the playback network may contain only one playback device. In certain embodiments, each player has an ability to retrieve its content for playback. Control and content retrieval can be distributed or centralized, for example. Input can include streaming content provider input, third party application input, mobile device input, user input, and/or other playback network input into the cloud for local distribution and playback.

As illustrated by the example system 700 of FIG. 7, a plurality of content providers 720-750 can be connected to one or more local playback networks 760-770 via a cloud and/or other network 710. Using the cloud 710, a multimedia playback system 720 (e.g., Sonos™), a mobile device 730, a third party application 740, a content provider 750 and so on can provide multimedia content (requested or otherwise) to local playback networks 760, 770. Within each local playback network 760, 770, a controller 762, 772 and a playback device 764, 774 can be used to playback audio content.

VII. Example Methods for Crossover Frequency Adjustment

As discussed previously, different zone players in the audio system may be configured to render different frequency sub-ranges of an audio content, and the different frequency sub-ranges may be determined according to playback characteristics of respective zone players in the audio system. Playback characteristics of the respective zone players may be defined by elements such as sizes of one or more audio speakers in a zone player, driver designs for the one or more audio speakers in the zone player, and/or overall construction of the zone player. As such, an optimal frequency sub-range may be determined for each zone player according to playback characteristics of the respective zone player, and the frequency sub-ranges rendered by the different zone players may be configured based on the determined respective optimal frequency sub-ranges. For example, the audio system may include a first zone player, which may include a sub-woofer and may therefore optimally render a low frequency sub-range of audio content. The audio system may further include a second zone player, which may include mid-range speakers and a tweeter, and may therefore optimally render a mid and high frequency sub-range of audio content. In one case, optimal frequency sub-ranges may be stored as state variables at the respective zone player and/or at a controller.

As mentioned before, the playback characteristics of the respective zone players may also vary based on a playback volume of the zone players. In other words, changes to the playback volume of a zone player may change the optimal frequency sub-range of the zone player. As such, embodiments herein are provided for adjusting frequency sub-ranges rendered by zone players in an audio system and the associated crossover frequencies according to changes in the playback volume of the audio system.

Figure 8:
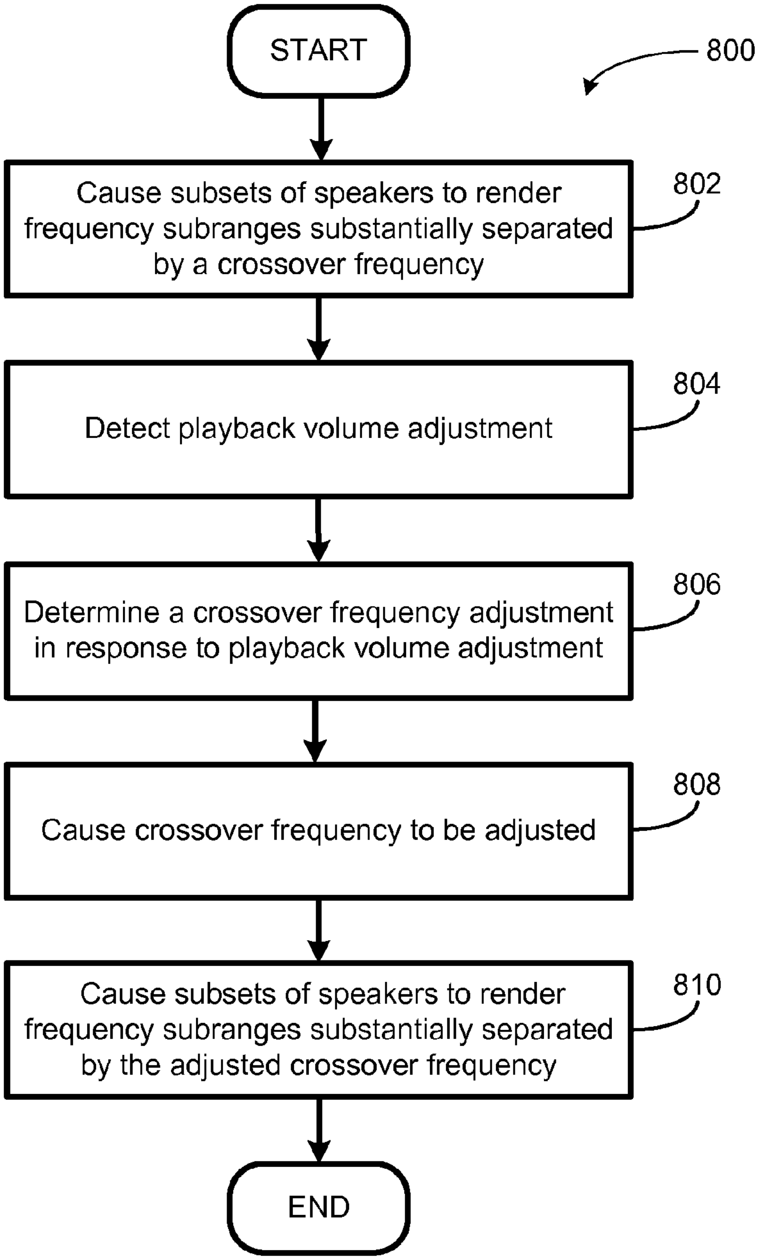
FIG. 8 shows an example flow diagram for crossover frequency adjustment.

FIG. 8 shows a first example flow diagram of a method 800 for crossover frequency adjustment, in accordance with at least some embodiments described herein. Method 800 shown in FIG. 8 presents an embodiment of a method that could be used in the environment 100 with the systems 200, 202, 204, 300, 400, and 500 for example, in communication with a device, such as devices illustrated in FIGS. 2-5, components of the devices. Method 800 may include one or more operations, functions, or actions as illustrated by one or more of blocks 802-810. Although the blocks are illustrated in sequential order, these blocks may also be performed in parallel, and/or in a different order than those described herein. Also, the various blocks may be combined into fewer blocks, divided into additional blocks, and/or removed based upon the desired implementation.

In addition, for the method 800 and other processes and methods disclosed herein, the flowchart shows functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for the method 800 and other processes and methods disclosed herein, each block in FIG. 8 may represent circuitry that is wired to perform the specific logical functions in the process.

At block 802, the method 800 may involve causing subsets of speakers to render frequency sub-ranges substantially separated by a crossover frequency. As discussed previously, a subset of speakers in an audio system may be one or more speakers in a zone player in the audio system. The subset of speakers in the audio system may also be one or more speakers from separate zone players.

In one example, the audio system may be rendering audio content having a frequency range of 20 Hz-20,000 Hz, and may distribute playback of different frequency sub-ranges of the audio content to first and second zone players based on the optimal playback frequency ranges of the zone players. In one case, the first and second zone players may be zone players 106 and 108, respectively in the Family Room zone of FIG. 1. The distribution of different frequency sub-ranges for playback by different zone players, as discussed previously, may be for improved audio playback quality.

For instance, the first zone player may be configured to render audio content substantially in the frequency sub-range of 20 Hz-80 Hz, while the second zone player may be configured to render audio content substantially in the frequency sub-range of 80 Hz-20,000 Hz. In this example, 80 Hz may be referred to as the crossover frequency.

Figure 9A:
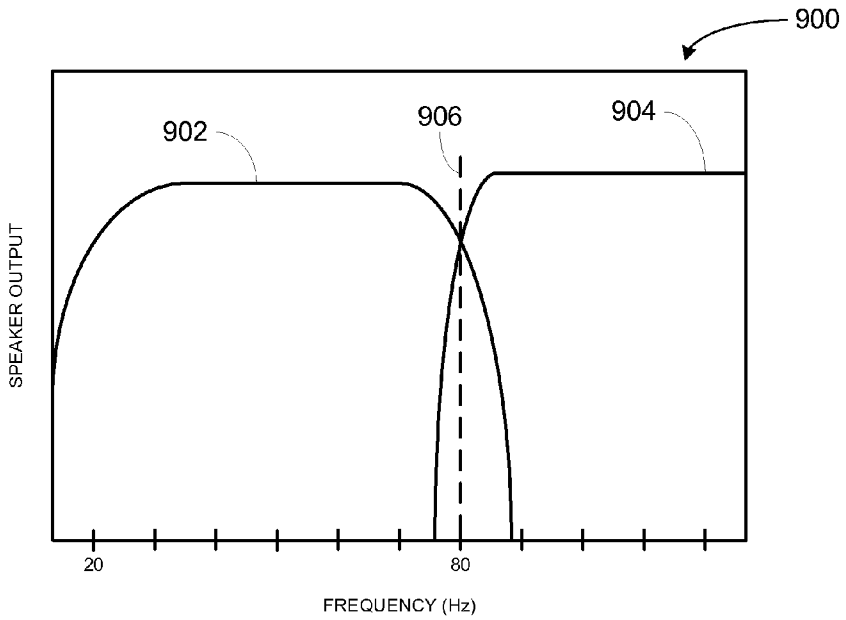
FIG. 9A shows an illustrative example of frequency sub-ranges substantially separated by a crossover frequency.

FIG. 9A shows an illustrative example of rendered frequency sub-ranges 902 and 904 substantially separated by a crossover frequency 906. As shown, the frequency sub-range of 20 Hz-80 Hz rendered by the first zone player may be represented by the frequency band 902, and the frequency sub-range 80 Hz-20,000 Hz rendered by the second zone player may be represented by the frequency band 904. Note that as illustrated, the crossover frequency 906 may represent a point where the frequency bands 902 and 904 are substantially separated. For example, the crossover frequency 906 may represent a frequency at which the output level of the frequency band 902 declines to half-power (or −3 dB), and where the output level of the frequency band 904 begins to exceed half-power.

In one example, the distribution of the different frequency sub-ranges to the first and second zone players may be performed locally at each of the zone players. For instance, both first and second zone players may receive the full frequency range of the audio content to be rendered, and may be configured to respectively filter in (or band-pass) components of the audio content to be rendered at the respective zone players. In other words, the first zone player may filter out frequencies above 80 Hz and render the remaining audio content, while the second zone player may filter out frequencies below 80 Hz and render the remaining audio content. As suggested previously, these configurations may be stored as state variables on the respective zone players and/or a controller.

In another example, the distribution of the different frequency sub-ranges to the first and second zone players may be performed at a system processor. The processor may receive state variables indicating optimal playback frequencies for zone players from the respective zone players and distribute the audio content accordingly. In this case, the system processor may filter the audio content and send audio content components filtered below or substantially below 80 Hz to the first zone player, and send audio content components filtered above or substantially above 80 Hz to the second zone player. In one case, one of the first or second zone players may be a "primary" player, which may be configured to manage the operations of the system as the system processor. In this case, if the first zone player is the primary player, the first zone player may be configured to separate or substantially separate frequency components of the audio content at the crossover frequency of 80 Hz (by various forms of audio filtering and signal processing), render the frequency components below or substantially below 80 Hz locally, and provide frequency components above or substantially above 80 Hz to the second zone player for playback.

In the course of enjoying audio content, the playback volume of the audio system may be adjusted, and at block 804, the method 800 may involve detecting such a playback volume adjustment. In one case, the playback volume may be increased by the user when a favorite song of the user is playing. In another case, the playback volume may be automatically decreased by the audio system based on a preset capping the playback volume after a certain time in the evening. In one example, the volume adjustment may be detected at a system level. For instance, the playback volume adjustment may be detected as a change in the amplification level of the audio signal by the audio system. In other words, the playback volume adjustment may refer to a change in the playback volume of the audio system. In one case, the volume adjustment may be detected when a command or request to adjust the volume is received at the system.

In another example, the volume adjustment may be detected at a hardware level. For instance, the playback volume adjustment may be detected at the output of the zone player. In one case, zone players in the audio system may include a volume detection microphone configured to detect audio speaker output levels. In another case, incremental amplifier thresholds may be implemented such that volume adjustment detection may occur when output volume from an amplifier in the zone player exceeds one of the amplifier thresholds.

In some scenarios, as described above, a default crossover frequency may be determined for a system such that an overall playback quality of the system is sufficiently adequate over a relatively wide range of equalization and volume settings. However, as mentioned above, a zone player may respond differently to the playback of the same frequency at different playback volumes. For example, a zone player rendering audio content of 100 Hz clearly at 65 dB may not render the same audio content at 90 dB as clearly. As such, the crossover frequency may be adjusted dynamically according to changes in playback volumes for improved audio content playback over a range of playback volumes.

At block 806, the method 800 may involve determining a crossover frequency adjustment in response to the detected playback volume adjustment. In one case, block 806 may involve determining whether a crossover frequency adjustment may be beneficial or necessary for improved audio content playback prior to determining the crossover frequency. In one example, determining that a crossover frequency adjustment may be beneficial or necessary may be based on thresholds determined during research and development (R&D) tests.

Continuing with the above example of the system having first and second zone players, and a crossover frequency of 80 Hz, distortion may become present in the lower frequency audio components rendered by the mid-range speakers in the second zone player as the playback volume increases. In this case, the system may determine that at the increased volume, the first zone player is capable of better rendering the lower frequency audio content distorted by the mid-range speaker, and thus determine that a crossover frequency adjustment may improve the audio content playback quality.

The crossover frequency adjustment may then be determined. For instance, a crossover frequency adjustment from 80 Hz to 120 Hz may be determined to result in improved audio content playback quality. The resulting frequency subrange may therefore be such that the first zone player now renders audio content in the frequency range of 20 Hz-120 Hz, and the second zone player now renders audio content in the frequency range of 120 Hz-20,000 Hz.

As suggested above, the adjustment of the crossover frequency may be a function of the playback volume, such that a change in the playback volume may result in a shift in the optimal crossover frequency for the system. In one case, the playback volume may refer to a volume setting of the system, as set by a user. In other words, the playback volume may not necessarily represent an actual volume of the outputted audio content, but rather a level of audio content signal amplification by a signal processor or power amplifier providing the audio content to the speakers of the zone player. In one example, the playback volume may be a value between 1 and 10.

In another case, the playback volume may refer to the actual audio output of the zone player. In this case, the audio output may be measured from the speaker output and may be represented in decibel units. The actual output of the zone player may vary depending on the audio content, even if the playback volume of the zone player is constant. For example, music often includes variations in loudness.

In either case, different playback volumes may be mapped to a corresponding optimal crossover frequency such that when the playback volume changes, whether by a user changing the playback volume or music getting louder or quieter, the crossover frequency may be dynamically adjusted for improved audio content playback. In the case the playback volume refers to a volume setting of the zone player, adjustments of the crossover frequency may occur as the volume setting of the zone player is changed. In the case the playback volume refers to the actual audio output, adjustments of the crossover frequency may occur whenever the audio output changes sufficiently such that audio content playback may be improved by adjusting the crossover frequency. In this case, crossover frequency adjustments may occur due to changes in loudness of the audio content itself, or indirectly as a result of changes to the playback volume of the zone player.

Figure 9B:
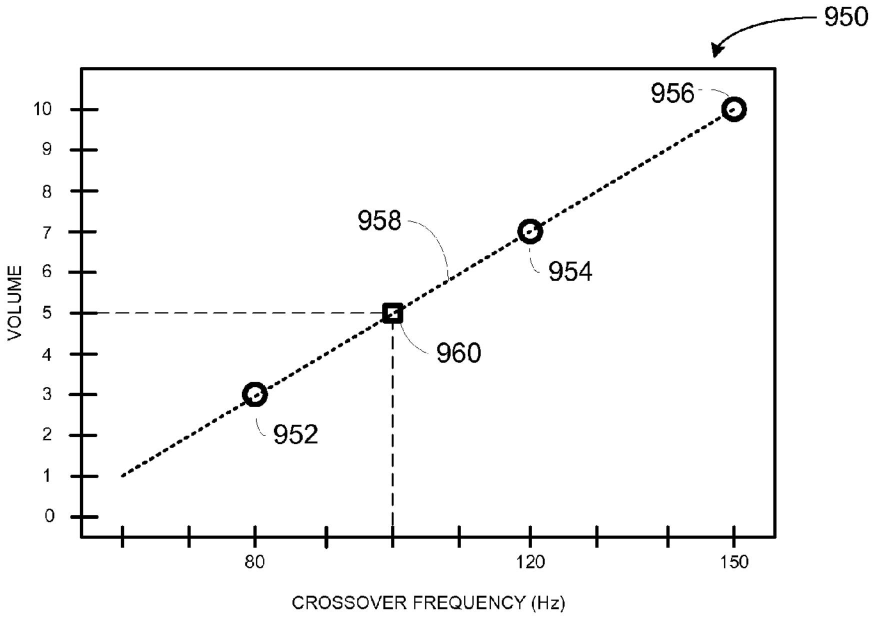
FIG. 9B shows an illustrative example of a relationship between playback volumes and optimal crossover frequencies.

FIG. 9B shows an illustrative example of a relationship curve 950 between playback volumes and optimal crossover frequencies for a zone player in an audio system. In one example, the mapping between playback volumes and corresponding crossover frequencies may be determined based on tests during R&D of the relevant zone players, to determine the optimal playback crossover frequencies at the various playback volumes. As illustrated in FIG. 9B, a crossover frequency of 80 Hz may be determined to be optimal for a volume setting of 3 out of 10, a crossover frequency of 120 Hz may be determined to be optimal for a volume setting of 7 out of 10, and a crossover frequency of 150 Hz may be determined to be optimal for a volume setting of 10 out of 10.

In the case the playback volume refers to the actual audio output, as opposed to volume setting in the above example, a crossover frequency of 80 Hz may be determined to be optimal for an audio output of 60 dB, a crossover frequency of 120 Hz may be determined to be optimal for an audio output of 80 dB, and a crossover frequency of 150 Hz may be determined to be optimal for an audio output of 90 dB.

In addition, corresponding crossover frequencies may also be mapped to different equalization settings and different playback volumes. For example, optimal crossover frequencies may be determined during R&D for a flat equalization setting (Bass, Mid, and Treble each set at 5 out of 10, for example) at volumes 3, 7, and 10, and optimal crossover frequencies may be determined during R&D for a scooped equalization setting (Bass and Treble at 8, Mid at 2, for example) for the same series of volumes 3, 7, and 10.

In such a case, relationships between playback volumes and optimal crossover frequencies such as that shown in FIG. 9B may be determined for a range of different equalization settings. In this case, adjustments to the playback equalization of the audio system or a zone player in the audio system may be detected, and corresponding crossover frequency adjustments may be determined for improved audio content playback quality at the new equalization setting. Similar examples may be provided based on actual audio output as well.

As discussed, the dynamic adjustments of crossover frequency may then be based on the mapping between playback volumes (and equalizations in some embodiments) and the corresponding optimal crossover frequencies. In one case, the crossover frequency may be adjusted step-wise, such that the crossover frequency of 80 Hz may be determined for any playback volume between 1 and 3, the crossover frequency of 120 Hz may be determined for any playback volume between 4 and 6, and the crossover frequency of 150 Hz may be determined for any playback volume 7 or over. In other words, the crossover frequency may be adjusted based on whether the playback volume surpasses one or more threshold playback volumes, for example.

In another case, a more continuous adjustment of the crossover frequency may be implemented. In this case, an interpolated crossover frequency may be determined for playback volumes without a predetermined corresponding crossover frequency. For example, as illustrated in FIG. 9B, for a playback volume of 5, which is half way between playback volumes 3 and 7, an interpolated crossover frequency of 100 Hz may be calculated as a midpoint 960 between the crossover frequencies 80 Hz and 120 Hz corresponding to the playback volumes 3 and 7, respectively. In another example, the interpolated crossover frequency may be determined from a best-fit curve representing a relationship between the playback volumes and available corresponding optimal crossover frequencies.

In yet another case, the optimal crossover frequency may be determined both step-wise and continuously. For example, a crossover frequency of 80 Hz may be determined for any playback volume between 0 and 3, while optimal crossover frequencies are interpolated for playback volumes between 3 and 10, as discussed above.

Note that in the above example, the optimal crossover frequency and the playback volume appear to be linearly related, as illustrated by the linear curve 958. This may be a simplified relationship between playback volumes and optimal crossover frequencies provided for illustrative purposes only. In some embodiments, the relationship between playback volumes and optimal crossover frequencies may be in the shape of a polynomial curve, such as an S-curve.

In a further example, crossover frequency adjustments may be determined not based on playback volume per se, but rather based on detected distortion in the rendered audio content. For example, if distortion is detected in the rendering of lower frequency components of the audio content by the mid-range speaker at a certain volume, the crossover frequency may be adjusted such that a subwoofer renders the lower frequency components of the audio content, thereby eliminating the distortion. In one case, the crossover frequency may be adjusted incrementally until the distortion is resolved. In this case, the crossover frequency corresponding to the certain volume may be stored in a state variable and used for reference when adjusting volumes in the future. For instance, a relationship curve between the optimal crossover frequency and volume maybe generated over time using this distortion elimination process each time the playback volume is adjusted.

In addition, crossover frequency adjustments may be determined based on a combination of both the mapping between playback volumes and the corresponding optimal crossover frequencies, and distortion detection. For instance, the mapping between playback volumes and corresponding optimal crossover frequencies may be utilized as a starting point when determining crossover frequency adjustments, and distortion detection may be used to refine the mapping and adjustments. In this case, the state variable storing the mapping between playback volumes and corresponding optimal crossover frequencies may be updated with the fine-tuned adjustments.

Note that thus far, discussions have been focused on crossover frequency adjustments between two zone players. In operation, the adjustment of crossover frequencies in response to detecting volume adjustments may be applied to an entire audio system having more than two zone players. In such a case, the adjustment of crossover frequencies may depend on the capabilities and characteristics of all zone players and/or speakers in the audio system. In other words, an optimal playback configuration is provided for the entire audio system, rather individual pairs of zone players.

Regardless of how the crossover frequency adjustments are determined, block 808 of method 800 may involve causing the crossover frequency to be adjusted according to the determined crossover frequency adjustment at block 806, and block 810 of method 800 may involve causing the subsets of audio speakers to render frequency sub-ranges substantially separated by the adjusted crossover frequency.

In one example, the crossover frequency adjustments may be implemented similarly to how distribution of the playback of different frequency sub-range components to the first and second zone players is implemented, as previously discussed. For example, if the distribution of the different frequency sub-range components to respective corresponding zone players is performed locally at each of the zone players, the respective corresponding zone players may continue to receive the full range of the audio content, and implement the crossover frequency adjustments by respectively filtering (or band-passing) components of the audio content according to the determined crossover frequency.

In one case, dynamic adjustment of crossover frequencies among multiple zone players may involve distributing a formula to each zone player in the audio system. The formula may be based on the availability of different zone players as well as characteristics of the different zone players or individual speakers, and may be used to determine the optimal crossover frequency when a volume adjustment to either the system or individual zone player is detected. In this instance, coefficients in the formula may be based on the characteristics of the zone players and/or individual speakers, and the input parameters may be the adjusted volume levels.

In the case the distribution of the different frequency sub-range components to the zone players is performed at a system processor (or primary player), the system processor may implement the crossover frequency adjustments by filtering the audio content according to the determined optimal crossover frequency and send to the different zone players audio content components having the respective corresponding frequency sub-ranges. Other examples of implementation may also exist.

Further, as mentioned above, while the above embodiments generally refer to a first and second zone player in the audio system, causing the subsets of audio speakers to render frequency sub-ranges substantially separated by the adjusted crossover frequency at block 810 may apply to all zone players in the audio system. In one case, different zone players in the audio system may implement different crossover frequencies based on the different playback characteristics of each zone player such that the overall playback quality of the audio system is improved. In a sense, the goal of the crossover frequencies may ultimately be to provide optimal playback quality by the audio system as a whole, and not just the individual zone players.

As mentioned above, a zone player in the system may have more than one speaker, and each of the speakers in the zone player may have a respective optimal playback frequency range. For instance, a zone player may have mid-range speakers for rendering mid frequency audio content and a tweeter for rendering high frequency audio content. Accordingly, the different speakers in the zone player may be configured to render different frequency components of the audio content based on the respective optimal playback frequency ranges, and one or more crossover frequencies may exist, defining the frequency sub-ranges rendered by the different speakers. As such, the one or more crossover frequencies between speakers within the zone player may also be adjusted in a similar manner as discussed above with respect to adjusting crossover frequencies between different zone players. Further, a corresponding frequency sub-range may be determined and adjusted accordingly, for each individual speaker in the system (not just each zone player in the system, or each speaker in a zone player). In one case, individual speaker in the system may be grouped according to their respective optimal playback frequency ranges, independent on which zone player an individual speaker is part of, and crossover frequency adjustments may be made between different groups of speakers.

While the above embodiments generally apply to crossover frequency adjustments in response to user-end or system-level adjustments to playback volume and/or equalization settings, one having ordinary skill in the art will appreciate that similar embodiments may be implemented to dynamically adjust crossover frequencies throughout the playback of audio content. For instance, in the case the audio content is a song with a wide volume range, and shifts in equalization (songs with loud and quiet section, and non-continuous sections of heavy bass), the crossover frequencies may be adjusted during playback of the audio content to provide optimal playback quality throughout the song.

Further, crossover frequency adjustments may also be made in response to changes in system configurations and/or playback characteristics. For instance, when a new zone player or speaker is added to the audio system, the audio system may adjust crossover frequencies to adapt to the addition of the new zone player or speaker, thereby providing optimal audio content playback quality. In another instance, a speaker or zone player may malfunction during the rendering of audio content. In this case, the audio system may adjust crossover frequencies to adapt to the absence of the new zone player or speaker, thereby providing optimal audio content playback quality. In either case, the updated crossover frequencies may be stored in a state variable at the respective zone player and/or the controller.

VIII. Conclusion

The descriptions above disclose various example systems, methods, apparatus, and articles of manufacture including, among other components, firmware and/or software executed on hardware. However, such examples are merely illustrative and should not be considered as limiting. For example, it is contemplated that any or all of these firmware, hardware, and/or software components can be embodied exclusively in hardware, exclusively in software, exclusively in firmware, or in any combination of hardware, software, and/or firmware. Accordingly, while the following describes example systems, methods, apparatus, and/or articles of manufacture, the examples provided are not the only way(s) to implement such systems, methods, apparatus, and/or articles of manufacture.

As provided in the embodiments discussed above, a crossover frequency between two subsets of audio speakers in a plurality of speakers may be adjusted in response to playback volume adjustments when rendering audio content. In one aspect, a method is provided. The method involves causing a first subset of a plurality of audio speakers to render a first sub-range of a range of audio frequencies of an audio content, and a second subset of speakers of the plurality of audio speakers to render a second sub-range of the range of audio frequencies. The first sub-range and the second sub-range are substantially separated at a first crossover frequency. The method may further involve detecting a playback volume adjustment of the audio content rendered by the plurality of speakers, and causing an adjustment of the first crossover frequency substantially separating the first sub-range and second sub-range based on the adjusted playback volume.

In another aspect, a system is provided. The system includes at least one processor, a non-transitory computer readable medium, and program instructions stored on the non-transitory computer readable medium. The program instructions are executable by the at least one processor to perform functions including causing a first subset of a plurality of audio speakers to render a first sub-range of a range of audio frequencies of an audio content, and a second subset of speakers of the plurality of audio speakers to render a second sub-range of the range of audio frequencies. The first sub-range and the second sub-range are substantially separated at a first crossover frequency. The functions may further involve detecting a playback volume adjustment of the audio content rendered by the plurality of speakers, and causing an adjustment of the first crossover frequency substantially separating the first sub-range and second sub-range based on the adjusted playback volume.

In yet another aspect, a non-transitory computer readable medium having instructions stored thereon is provided. The instructions are executable by a computing device to cause the computing device to perform functions including causing a first subset of a plurality of audio speakers to render a first sub-range of a range of audio frequencies of an audio content, and a second subset of speakers of the plurality of audio speakers to render a second sub-range of the range of audio frequencies. The first sub-range and the second sub-range are substantially separated at a first crossover frequency. The functions may further involve detecting a playback volume adjustment of the audio content rendered by the plurality of speakers, and causing an adjustment of the first crossover frequency substantially separating the first sub-range and second sub-range based on the adjusted playback volume.

Additionally, references herein to “embodiment” means that a particular feature, structure, or characteristic described in connection with the embodiment can be included in at least one example embodiment of the invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

When any of the appended claims are read to cover a purely software and/or firmware implementation, at least one of the elements in at least one example is hereby expressly defined to include a tangible medium such as a memory, DVD, CD, Blu-ray, and so on, storing the software and/or firmware.

We claim:

1. A method comprising:

causing a first subset of a plurality of audio speakers to render a first sub-range of a range of audio frequencies of an audio content, and a second subset of the plurality of audio speakers to render a second sub-range of the range of audio frequencies, wherein the first sub-range and the second sub-range are substantially separated at a first crossover frequency;

detecting a playback volume adjustment of the audio content rendered by the plurality of speakers; and causing an adjustment of the first crossover frequency substantially separating the first sub-range and second sub-range based on the adjusted playback volume, such that the first subset of speakers renders a sub-range of the range of audio frequencies that is different from the first sub-range and the second subset of speakers renders a sub-range of the range of audio frequencies that is different from the second sub-range.

2. The method of claim 1, wherein the first sub-range of the range of audio frequencies is determined according to first audio rendering characteristics of the first subset of the plurality of audio speakers, and wherein the second sub-range of the range of audio frequencies is determined according to second audio rendering characteristics of the second subset of the plurality of audio speakers.

3. The method of claim 2, wherein causing an adjustment of the first crossover frequency substantially separating the first sub-range and second sub-range based on the volume adjustment comprises:

determining a new crossover frequency based on predetermined relationships between the playback volume adjustment and the first and second audio rendering characteristics; and causing an adjustment of the first crossover frequency to such that the first crossover frequency is the same as the determined new crossover frequency.

4. The method of claim 1, wherein causing an adjustment of the first crossover frequency substantially separating the first sub-range and second sub-range based on the volume adjustment comprises:

detecting a rendition of the first sub-range of the audio content at the adjusted playback volume;

determining a crossover frequency adjustment based on the detected rendition of the first sub-range of the audio content; and causing the adjustment of the first crossover frequency based on the determined crossover frequency adjustment.

5. The method of claim 4, wherein determining a crossover frequency adjustment based on the detected rendition of the first sub-range of the audio content comprises:

determining that a crossover frequency adjustment will improve a quality of the rendition of the first sub-range of the range of audio frequencies of the audio content at the adjusted playback volume.

6. The method of claim 4, wherein determining a crossover frequency adjustment based on the detected rendition of the first sub-range of the audio content comprises:

determining a level of audio distortion in the detected rendition of the first sub-range of the audio content; and determining a crossover frequency adjustment based on the level of audio distortion.

7. The method of claim 4, further comprising:

associating the adjusted first crossover frequency with the adjusted playback volume; and storing the association between the adjusted first crossover frequency and the adjusted playback volume.

8. The method of claim 1, wherein causing a first subset of a plurality of audio speakers to render a first sub-range of a range of audio frequencies of an audio content comprises causing at least one audio speaker in a playback device from the first subset of the plurality of audio speakers to render the first sub-range of the range of audio frequencies of the audio content, and wherein causing a second subset of the plurality of audio speakers to render a second sub-range of the range of audio frequencies comprises causing at least one audio speaker in the playback device from the second subset of the plurality of audio speakers to render the second sub-range of the range of audio frequencies of the audio content.

9. The method of claim 1, further comprising:

causing a third subset of the plurality of audio speakers to render a third sub-range of the range of audio frequencies, wherein the third sub-range and the second sub-range are substantially separated at a second crossover frequency; and causing an adjustment of the second crossover frequency substantially separating the second sub-range and the third sub-range based on the volume adjustment, such that the second subset of speakers renders a sub-range of the range of audio frequencies that is different from the second sub-range and the third subset of speakers renders a sub-range of the range of audio frequencies that is different from the third sub-range.

10. The method of claim 9, wherein causing a first subset of a plurality of audio speakers to render a first sub-range of a range of audio frequencies of an audio content comprises causing at least one audio speaker in a playback device from the first subset of the plurality of audio speakers to render the first sub-range of the range of audio frequencies of the audio content, wherein causing a second subset of the plurality of audio speakers to render a second sub-range of the range of audio frequencies comprises causing at least one audio speaker in the playback device from the second subset of the plurality of audio speakers to render the second sub-range of the range of audio frequencies of the audio content, and wherein causing a third subset of the plurality of audio speakers to render a third sub-range of the range of audio frequencies comprises causing at least one audio speaker in the playback device from the third subset of the plurality of audio speakers to render the third sub-range of the range of audio frequencies of the audio content.

11. A system comprising:

at least one processor;

a non-transitory computer readable medium; and program instructions stored on the non-transitory computer readable medium and executable by the at least one processor to perform functions comprising:

causing a first subset of a plurality of audio speakers to render a first sub-range of a range of audio frequencies of an audio content, and a second subset of speakers of the plurality of audio speakers to render a second sub-range of the range of audio frequencies, wherein the first sub-range and the second sub-range are substantially separated at a first crossover frequency;

detecting a playback volume adjustment of the audio content rendered by the plurality of speakers; and causing an adjustment of the first crossover frequency separating the first sub-range and second sub-range based on the adjusted playback volume, such that the first subset of speakers renders a sub-range of the range of audio frequencies that is different from the first sub-range and the second subset of speakers renders a sub-range of the range of audio frequencies that is different from the second sub-range.

12. The system of claim 11, wherein the first sub-range of the range of audio frequencies is determined according to first audio rendering characteristics of the first subset of the plurality of audio speakers, and wherein the second sub-range of the range of audio frequencies is determined according to second audio rendering characteristics of the second subset of the plurality of audio speakers.

13. The system of claim 12, wherein causing an adjustment of the first crossover frequency substantially separating the first sub-range and second sub-range based on the volume adjustment comprises:

determining a new crossover frequency based on predetermined relationships between the playback volume adjustment and the first and second audio rendering characteristics; and causing an adjustment of the first crossover frequency to such that the first crossover frequency is the same as the determined new crossover frequency.

14. The system of claim 11, wherein causing an adjustment of the first crossover frequency substantially separating the first sub-range and second sub-range based on the volume adjustment comprises:

detecting a rendition of the first sub-range of the audio content at the adjusted playback volume;

determining a crossover frequency adjustment based on the detected rendition of the first sub-range of the audio content; and causing the adjustment of the first crossover frequency based on the determined crossover frequency adjustment.

15. The system of claim 14, wherein determining a crossover frequency adjustment based on the detected rendition of the first sub-range of the audio content comprises:

determining that a crossover frequency adjustment will improve a quality of the rendition of the first sub-range of the range of audio frequencies of the audio content at the adjusted playback volume.

16. The system of claim 14, wherein determining a crossover frequency adjustment based on the detected rendition of the first sub-range of the audio content comprises:

determining a level of audio distortion in the detected rendition of the first sub-range of the audio content; and determining a crossover frequency adjustment based on the level of audio distortion.

17. A non-transitory computer-readable medium having stored thereon instructions executable by a computing device to cause the computing device to perform functions comprising:

causing a first subset of a plurality of audio speakers to render a first sub-range of a range of audio frequencies of an audio content, and a second subset of speakers of the plurality of audio speakers to render a second sub-range of the range of audio frequencies, wherein the first sub-range and the second sub-range are substantially separated at a first crossover frequency;

detecting a playback volume adjustment of the audio content rendered by the plurality of speakers; and causing an adjustment of the first crossover frequency separating the first sub-range and second sub-range based on the adjusted playback volume, such that the first subset of speakers renders a sub-range of the range of audio frequencies that is different from the first sub-range and the second subset of speakers renders a sub-range of the range of audio frequencies that is different from the second sub-range.

18. The non-transitory computer-readable medium of claim 17, wherein causing a first subset of a plurality of audio speakers to render a first sub-range of a range of audio frequencies of an audio content comprises causing at least one audio speaker in a playback device from the first subset of the plurality of audio speakers to render the first sub-range of the range of audio frequencies of the audio content, and wherein causing a second subset of the plurality of audio speakers to render a second sub-range of the range of audio frequencies comprises causing at least one audio speaker in the playback device from the second subset of the plurality of audio speakers to render the second sub-range of the range of audio frequencies of the audio content.

19. The non-transitory computer-readable medium of claim 17, wherein the instructions are further executable by the computing device to cause the computing device to perform functions comprising:

causing a third subset of the plurality of audio speakers to render a third sub-range of the range of audio frequencies, wherein the third sub-range and the second sub-range are substantially separated at a second crossover frequency; and causing an adjustment of the second crossover frequency substantially separating the second sub-range and the third sub-range based on the volume adjustment, such that the second subset of speakers renders a sub-range of the range of audio frequencies that is different from the second sub-range and the third subset of speakers renders a sub-range of the range of audio frequencies that is different from the third sub-range.

20. The system of claim 11, wherein the system comprises the plurality of audio speakers.

* * * * *